United States Patent [19]

Love

[11] 4,000,676

[45] Jan. 4, 1977

[54] ELECTRONIC VIBRATO SYSTEM

[76] Inventor: David A. Love, 600 Langsdorf Drive, Apt. B-22, Fullerton, Calif. 92631

[22] Filed: Sept. 20, 1974

[21] Appl. No.: 507,890

[52] U.S. Cl. .......................... 84/1.25; 84/DIG. 26; 179/1 J; 332/16 R; 332/22; 333/29

[51] Int. Cl.² ...................... G10H 1/04; H03H 7/30

[58] Field of Search ................. 84/1.01, 1.24, 1.25, 84/DIG. 26; 179/1 J; 333/29; 332/16 R, 22

[56] References Cited

UNITED STATES PATENTS

| | | | |
|---|---|---|---|
| 3,609,205 | 9/1971 | Schwartz et al. | 84/1.25 |
| 3,626,078 | 12/1971 | Sekiguchi | 84/1.24 |
| 3,644,657 | 2/1972 | Miller | 84/1.25 |
| 3,681,531 | 8/1972 | Burkhard et al. | 179/1 J |
| 3,749,837 | 7/1973 | Doughty | 179/1 J |
| 3,833,752 | 9/1974 | Van Der Kooij | 84/1.24 |
| 3,842,204 | 10/1974 | Leslie | 179/1 J |
| 3,895,553 | 7/1975 | Kawamoto | 84/1.24 |
| 3,920,905 | 11/1975 | Sharp | 179/1 J |

*Primary Examiner*—Stanley J. Witkowski
*Attorney, Agent, or Firm*—Philip M. Hinderstein

[57] ABSTRACT

A method and means for modulating the frequency of an analog signal to achieve a vibrato effect wherein the analog signal is transmitted through an analog shift register or delay line under the control of a digital clock signal and wherein the frequency of the digital clock signal is varied at a rate equal to the desired rate of modulation of the analog signal. In this manner, the output of the shift register is a delayed version of the input thereto, with the frequency modulated at the same rate that the clock signal frequency is modulated. According to the preferred embodiment of the invention, first and second shift registers are utilized and the analog signal is divided into upper and lower frequency bands which are separately applied to the two shift registers. Furthermore the shift register which receives the lower frequency band is clocked at one-half the rate of the shift register which receives the higher frequency band.

9 Claims, 4 Drawing Figures

ELECTRONIC VIBRATO SYSTEM

BACKGROUND OF THE INVENTION

1. Field of the Invention.

The present invention relates to an electronic vibrato system and, more particularly, to a method and means for modulating the frequency of an analog signal with no frequency discrimination and with no corresponding modulation of the amplitude thereof.

2. Description of the Prior Art.

In music, the vibrato effect is caused by modulating either the frequency or phase of an audio frequency signal. The vibrato effect is sensed as a ringing of the audio signal and is quite pleasing to the ear. Thus, the vibrato effect is widely used.

What is generally considered to be the first vibrato system was invented by Donald Leslie, The Leslie system being based on the theory of a rotating speaker. That is, if an audio signal is applied to a speaker which is rotated about an axis perpendicular to its output direction, the speaker physically moves toward and away from a listener and a vibrato effect is achieved. However, since it is not practical to rotate the speaker itself, the same effect is achieved either by directing the output of a speaker through a horn and rotating the horn or by mounting a speaker within a drum having a series of openings therein and rotating the drum. In either event, the vibrato effect is achieved mechanically by rotating a speaker or its equivalent.

While the Leslie speaker system has gained a wide degree of acceptance, numerous problems exist therewith. Because of the necessity of mechanically rotating a speaker or its equivalent, the speaker cabinet must contain a drive motor and belts for interconnecting the motor to the speaker. The motor must be oiled and the belts periodically tightened to prevent slippage thereof. In addition, the cable connecting the speaker system to the audio source is large and cumbersome because of the necessity of conducting power and other control signals to the drive motor. Furthermore, there is always a certain amount of noise associated with the mechanically moving parts and it is difficult to control the speed of the motor accurately.

It is conventional, in Leslie speaker systems, to drive the speakers at either approximately 1 Hz or approximately 6 Hz to achieve either a slow or a fast vibrato effect. However, since the speakers are rotating mechanically, it is impossible to rapidly speed up or slow down the motor when changing the mode of operation. While many songs have been written to take advantage of this time delay in changing vibrato speed, it is generally considered to be undesirable.

Numerous attempts have been made to overcome the problems associated with the Leslie speaker system. Typically, light dependent resistors (LDR's) or thermistors have been used in phase shift circuits which receive the analog signal. By modulating the resistance valves of such LDR's or thermistors, the phase shift of the circuits may be varied to give the desired vibrato effect. However, numerous problems exist with such phase shift circuits too. Such circuits are subject to excessive noise and often produce some degree of undesirable amplitude modulation in addition to the phase modulation. Such circuits are often highly frequency selective so that different frequencies are shifted by different amounts and this is also highly undesirable. The waveshape of the ultimate signal is often severely distorted and such circuits are capable of providing limited frequency shifts in time.

Other solutions to the above problems have been very costly. For example, in order to avoid the frequency selectivity of phase shift circuits, it has been proposed to divide the audio band into many sections and to use separate phase shifters for each section. Or, it has been proposed to cascade many phase shifting networks. However, in these as well as in other approaches, it simply has not been possible to provide a variable or fixed change in frequency, phase, or time of an entire band of audio frequencies without discrimination, without excessive noise, without wave-shape distortion, without amplitude modulation, and at a reasonable cost.

SUMMARY OF THE INVENTION

In accordance with the present invention, all of the problems associated with the mechanical Leslie speaker system are solved by providing a purely electronic vibrato system. In addition, the present vibrato system solves the problems of previous electronic vibrato systems in that there is no noise, there is no frequency discrimination, there is no undesired amplitude modulation, and there is no waveshape distortion. The present system is applicable to any music system or any situation where an analog signal is to be shifted in frequency or phase with no change in amplitude. The present system can be manufactured with conventional components and is relatively inexpensive compared not only to the Leslie approach but to other electronic aproaches.

Briefly, a vibrato effect is achieved by inserting an analog signal into a multi-stage, clock controlled, analog shift register which samples the waveshape and shifts the sampled waveshape through a series of stages and reassembles the waveshape at the output of the shift register. The speed at which the waveshape is sampled and shifted is determined by a digital clock. Since the entire waveshape is accepted, sampled, and reassembled, there is no distortion of the waveshape at the output of the shift register and no frequency selectivity. Furthermore, the frequency of the digital clock is modulated at a rate equal to the desired rate of modulation of the analog signal. In this manner, the output of the shift register is a delayed version of the input thereto, with the entire frequency band modulated at the same rate that the clock signal frequency is modulated.

According to the preferred embodiment of the invention, first and second shift registers are utilized and the analog signal is divided into upper and lower frequency bands which are separately applied to the two shift registers. By clocking the shift register which receives the lower frequency band at a lower rate than the shift register which receives the upper frequency band, the vibrato effect of the lower frequencies may be enhanced over that previously obtainable. Furthermore, in this manner, the Doppler effect of the conventional Leslie system may be accurately simulated.

OBJECTS

It is therefore an object of the present invention to provide an electronic vibrato system.

It is a further object of the present invention to provide a method and means for modulating the frequency or phase of an analog signal.

It is a still further object of the present invention to provide an electronic vibrato system having a high degree of noise immunity.

It is another object of the present invention to provide a method and means for modulating the frequency or phase of an analog signal with no frequency discrimination.

It is still another object of the present invention to provide a method and means for modulating the frequency or phase of an analog signal with no corresponding modulation of the amplitude thereof.

Another object of the present invention is the provision of an electronic vibrato system in which the waveshape is undistorted.

Still other objects, features, and attendant advantages of the present invention will become apparent to those skilled in the art from a reading of the following detailed description of the preferred embodiments constructed in accordance therewith, taken in conjunction with the accompanying drawings wherein like numerals designate like parts in the several figures and wherein:

DESCRIPTION OF THE PREFERRED EMBODIMENTS

Figure 1:
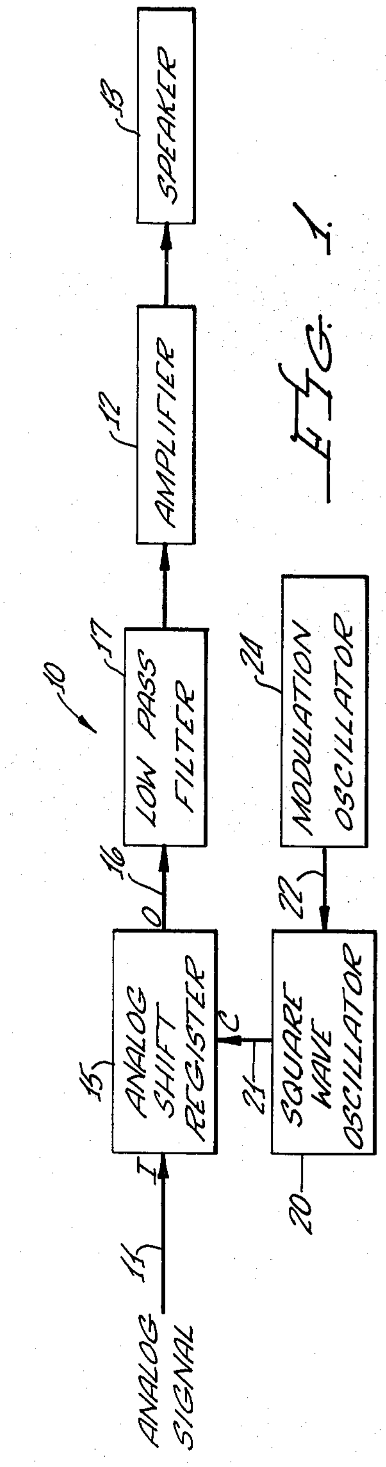
FIG. 1 is a block diagram of the simplest form of electronic vibrato system constructed in accordance with the teachings of the present invention.

Referring now to the drawings and, more particularly, to FIG. 1 thereof, the present electronic vibrato system, generally designated 10, is applicable to any music system or any situation where an analog signal, present on a line 11, is to be amplified by an amplifier 12 and applied to a speaker 13 to produce an acoustical signal. Electronic vibrato system 10 is operative to modulate each and every frequency component of the analog signal on line 11 by an equal amount before application to amplifier 12. Since frequency and phase modulation are equivalent concepts, the discussion hereinafter will refer to frequency modulation but will be understood to apply equally to phase modulation.

More specifically, the analog signal on line 11 is applied to the signal input terminal I of a multi-stage, clock controlled, analog shift register 15 which also has a signal output terminal O and a clock input terminal C. Analog shift register 15 has the capability of sampling the value of the signal at its signal input terminal I and to shift the sampled signal to the signal output terminal O, stage by stage, under control of a clock signal applied to the clock input terminal C. The analog signal is reassembled at signal output terminal O and applied to a line 16. Thus, the output signal appearing on line 16 is identical to the input signal appearing on line 11, except that the output signal has been delayed relative to the input signal by an amount determined by the number of stages of shift register 15 and the clock signal frequency.

While shift register 15 may be any type of analog shift register or analog delay line, such terms being fully equivalent, shift register 15 is preferably a bucket brigade circuit of a type well known to those skilled in the art. A typical bucket brigade circuit comprises a plurality of series-connected field-effect transistors and integrated capacitors. Every period of the signal to be delayed is disintegrated into consecutive pulses which are pushed, step by step, one after the other, through the bucket brigade and are thus delayed by a time which depends upon the clock frequency and the number of "buckets". At the output of the bucket brigade, the rearranged pulses generate an analog output signal. The clock signal which is superimposed on the analog output signal may be removed by a low pass filter 17 which is interposed between line 16 and amplifier 12.

In order to clock shift register 15, vibrato system 10 includes a square wave oscillator 20, the output of which, on a line 21, is a square wave which is applied to the clock input terminal C of shift register 15. The main requirement for square wave oscillator 20 is that it must have the ability to have its output frequency swept over a relatively wide range. Thus, oscillator 20 may be either a voltage or current controlled oscillator whose output frequency is a function of the voltage or current at the input thereto, on a line 22. With the voltage or current on line 22 constant, oscillator 20 produces a square wave signal on line 21 of constant frequency, which square wave signal is used to clock the analog signal on line 11 through shift register 15.

According to the present invention, vibrato system 10 also includes a modulation oscillator 24, of any suitable type, which produces a symmetrical sine wave, of constant amplitude, in the subaudio frequency range. The output of oscillator 24 is applied to line 22 as a control voltage or current for oscillator 20. Thus, by sweeping the control voltage or current of oscillator 20, the output frequency thereof, on line 21, is modulated at a rate equal to the output frequency of oscillator 24. On the other hand, the amount of swing (the frequency deviation) of the output frequency of oscillator 20 is controlled externally by biasing voltages, the amplitude of oscillator 24 and the like.

If analog signal 11 is a conventional audio frequency signal in the range of 0 to 20 kHz, the clock frequency of oscillator 20 must be at least equal to twice the highest frequency component to prevent distortion at the output of shift register 15. Furthermore, to simulate the vibrato effect caused by the conventional Leslie speaker system, modulation oscillator 24 would normally operate within the frequency range of 0.5 Hz to 10 Hz.

In operation, the waveshape of the analog signal on line 11 exits from low pass filter 17 totally unaltered, with no amplitude modulation and with no frequency distortion. The only effect of shift register 15 is that the signal is delayed in time by an amount which depends upon the frequency of oscillator 20 and the number of stages in shift register 15. On the other hand, since the clock frequency of oscillator 20 is modulated about a center frequency at a rate equal to the output frequency of oscillator 24, the delay introduced by shift register 25 is constantly changing, at the modulation frequency rate. This constantly changing delay introduced by shift register 15 causes the analog signal passing therethrough to periodically expand and contract, in a symmetrical manner, at the same rate, producing, electronically, a pure frequency modulation, the desired vibrato effect.

The frequency deviation of the analog signal will be a function of the deviation from the center frequency of oscillator 20. Therefore, if the frequency of oscillator 20 is modulated only slightly, there will be only a slight modulation of the analog signal and the vibrato effect will be slight. On the other hand, if the frequency of oscillator 20 is varied over a wide range, there will be a substantial deviation of the analog signal and the vibrato effect will be pronounced. Thus, with the present system, the "depth" of the vibrato effect may be controlled over a wide range, something which has not been possible with the Leslie system and with other systems. According to a preferred embodiment of the invention, the clock signal applied to shift register 15 is approximately 200 kHz and has a deviation of ±100 kHz, i.e. the frequency varies between 100 kHz and 300 kHz.

Figure 2:
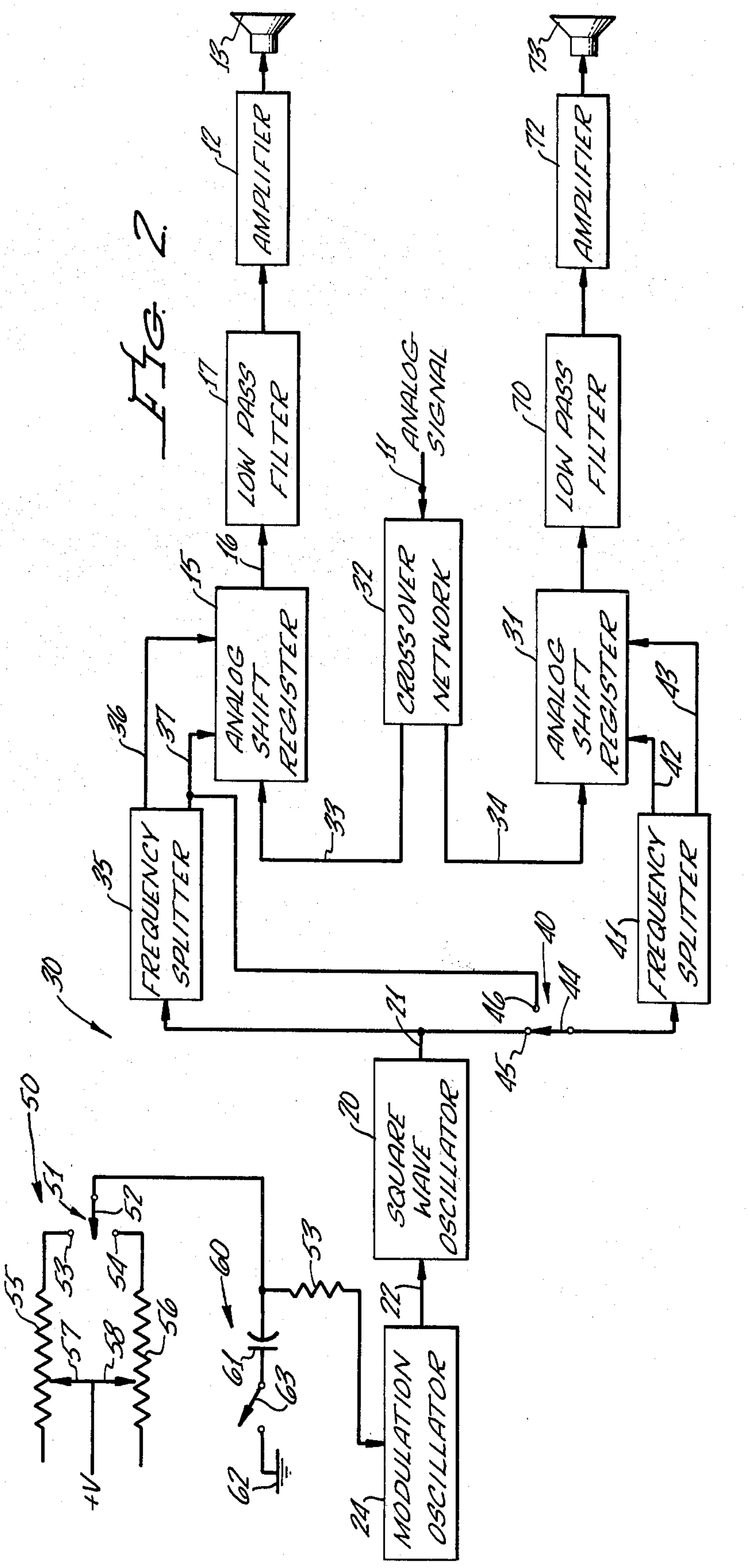
FIG. 2 is a block diagram of the preferred embodiment of the present electronic vibrato system.

Referring now to FIG. 2, a preferred embodiment of electronic vibrato system, generally designated 30, incorporates all of the principals of vibrato system 10 and includes analog shift register 15, low pass filter 17, amplifier 12, speaker 13, square wave oscillator 20, and modulation oscillator 24, all operating as described previously. In addition, the analog signal is applied to vibrato system 30 over line 11. The significant difference between vibrato system 30 and vibrato system 10 is that vibrato system 30 includes a second, multi-stage, analog shift register 31 which is identical to shift register 15. Furthermore, the analog signal is first applied to a crossover network 32 which divides the analog signal into upper and lower frequency bands, the upper frequency band being applied over a line 33 to the signal input of analog shift register 15 and the lower frequency band being applied over a line 34 to the signal input of shift register 31.

Conventional bucket brigade circuits require two non-overlapping pulses in phase opposition for driving same. Therefore, the output of square wave oscillator 20, on line 21, is applied to a first frequency splitter 35 which generates first and second non-overlapping square waves, which are 180° out of phase, on lines 36 and 37, respectively, the frequency of the square waves on lines 36 and 37 being one-half the output frequency of square wave oscillator 20. Frequency splitter 35 may be a conventional flip-flop having complementary outputs. In any event, these square waves are applied to the clock inputs of shift register 15 for clocking same, in a manner well known to those skilled in the art.

Under certain circumstances, as will be described more fully hereinafter, it may be desirable to clock shift registers 15 and 31 at the same rate, whereas under other circumstances it may be desirable to clock them at different rates. Therefore, vibrato system 30 includes a second frequency splitter 41, which is identical to frequency splitter 35, and which provides, on output lines 42 and 43, first and second non-overlapping square waves, of opposite phase, which are applied to the clock inputs of shift register 31. The input of frequency splitter 41 is connected to the arm 44 of a switch 40, arm 44 being adapted to be positioned in contact with either of two terminals 45 or 46. Terminal 45 is connected to line 21 whereas terminal 46 is connected either to line 36 or to line 37. Thus, when arm 44 of switch 40 is in contact with terminal 45, frequency splitter 41 receives the same input as frequency splitter 35 and generates the same output thereas. With arm 44 of switch 40 in contact with terminal 46, frequency splitter 41 receives one of the outputs of frequency splitter 35 and generates a pair of square wave outputs having half the frequency of the outputs of frequency splitter 35.

Vibrato system 30 also includes means, generally designated 50, for selecting the operating frequency of oscillator 24 so as to produce either a slow vibrato effect or a fast vibrato effect. If, for example, oscillator 24 is the type whose output frequency may be varied by controlling the resistance within a biasing circuit, frequency selector circuit 50 may comprise a switch 51 including an arm 52 which is connected via a fixed resistor 53 to oscillator 24. Arm 52 of switch 51 is adapted to be positioned in contact with either of terminals 53 or 54, which are connected to variable resistors 55 and 56, respectively. Resistors 55 and 56 include independently moveable arms 57 and 58, respectively, which are both connected to a source of bias voltage V+. Thus, depending upon the position of arm 52 of switch 51, bias source V+ is connected to oscillator 24 either through resistor 55 or through resistor 56. According to the preferred embodiment of the present invention, the values of resistors 55 and 56 are chosen to produce an output frequency from oscillator 24 of approximately 1.0 Hz and approximately 6.5 Hz, respectively, to accurately simulate the slow and fast vibrato effects produced by conventional Leslie speaker systems. On the other hand, by making both of resistors 55 and 56 variable, as shown, slight modifications in the vibrato frequency can readily be made.

Since vibrato system 30 is totally electronic, oscillator 24 will change substantially instantaneously from a first frequency to a second frequency as arm 52 of switch 51 is moved between terminals 53 and 54. On the other hand, it may be desirable, under certain circumstances, to simulate the slow change between the slow and fast vibrato modes characteristic of the Leslie system. For this purpose, vibrato system 30 may include delay means, generally designated 60, interposed between frequency selector 50 and oscillator 24 to control the rate at which the modulation frequency of oscillator 24 changes between the two frequencies determined by resistors 55 and 56. According to the present invention, delay means 60 may simply be a capacitor 61 connected between the junction between arm 52 and resistor 53 and ground 62 via a mode selector switch 63.

With switch 63 open, capacitor 61 is removed from the circuit and the frequency of oscillator 24 will change substantially instantaneously as arm 52 of switch 51 is moved between terminals 53 and 54. On the other hand, with switch 63 closed and capacitor 61 connected between ground and arm 52 of switch 51, capacitor 61 will develop a charge which cannot instantaneously change as arm 52 is moved between terminals 53 and 54. Thus, as arm 52 moves between terminals 53 and 54, a time delay will be interposed depending upon the time constant of the circuit, which time constant may be readily adjusted to produce any desired effect.

One of the undesirable features of the Leslie speaker system is that the vibrato effect becomes more pronounced as the frequency increases. The reason for this is that the wavelength of the lower frequencies is so long that it cannot be adequately modulated within the space limitations of a Leslie speaker cabinet. Thus, when simultaneously listening to a high frequency tone and a low frequency tone in a Leslie speaker system, the vibrato effect of the low frequency tone is almost inaudible compared to that of the high frequency tone. This is partially compensated for in the Leslie system by the use of separate high and low frequency speakers which are rotated in a different manner, as explained previously. A desired result of separate high and low frequency speakers is that a beat frequency results, due to the Doppler effect, which is a function of the difference between the vibrato effect of the high frequencies and the vibrato effect of the low frequencies.

According to the present invention, the latter desirable beat frequency effect of the Leslie system is retained while simultaneously eliminating the former undesirable inadequate vibrato effect in the lower frequencies. More specifically, the analog signal on line 11 is applied to crossover network 32 which applies the higher frequencies to shift register 15 and the lower frequencies to shift register 31. Furthermore, with arm 44 of switch 40 in contact with terminal 46, shift register 31 is clocked at one-half the rate of shift register 15. While the rate of modulation of such clock frequency remains the same and the percentage of deviation of the clock signal also remains the same, it has been experimentally determined that the use of a clock frequency for the low frequency shift register 31 which is approximately one-half the clock frequency for the high frequency shift register 15 operates to substantially increase the depth of the vibrato effect for the lower frequencies. Thus, when simultaneously listening to a high frequency tone from shift register 15 and a low frequency tone from shift register 31, the vibrato effect of both tones is essentially equal and both are clearly sensed.

In addition, since the lower frequencies are transmitted through shift register 31 at half the rate that the higher frequencies are transmitted through shift register 15, shift register 31 creates twice the delay as that of shift register 15 so that the output signals have different delays, thereby creating a Doppler beat signal which accurately simulates the beat signal produced by a Leslie speaker system. In fact, the beat signal produced by vibrato system 30 is even more pronounced than that achieved with a Leslie speaker system. Therefore, by separately phase shifting the upper and lower frequencies of the input analog signal, a vibrato effect can be achieved which is at least equal to but in many respects far superior to that achieved with conventional Leslie speaker systems. Furthermore, while the analog signal on line 11 has been described as being divided into two frequency bands, it will be apparent that it may be divided into three or more bands.

It should be noted that under certain circumstances this enhancing of the vibrato effect for the lower frequencies and the resultant beat signal may not be desired. If this is the case, arm 44 of switch 40 may be positioned in contact with terminal 45 whereupon the lower frequencies are shifted through shift register 31 at the same rate that the higher frequencies are shifted through shift register 15.

The output of shift register 31 is also applied to a low pass filter 70 to suppress the superimposed clock signal. Thereafter, the output of low pass filter 70 may be combined with the output of low pass filter 17 in amplifier 12 before application to speaker 13. On the other hand, rather than combining the outputs of shift registers 15 and 31 in this manner, low pass filter 70 preferably feeds a second amplifier 72, the output of which is applied to a separate speaker system 73. This latter approach has two advantages. In the first instance, speaker 13 may be specifically designed to receive the mid and high frequencies of the audio frequency range whereas speaker 73 may be specifically designed to receive the low frequencies of the audio frequency range. Secondly, with this approach, the outputs of shift registers 15 and 31 are combined acoustically and this has been demonstrated to enhance the Doppler beat frequency vibrato effect discussed previously.

Figure 3:
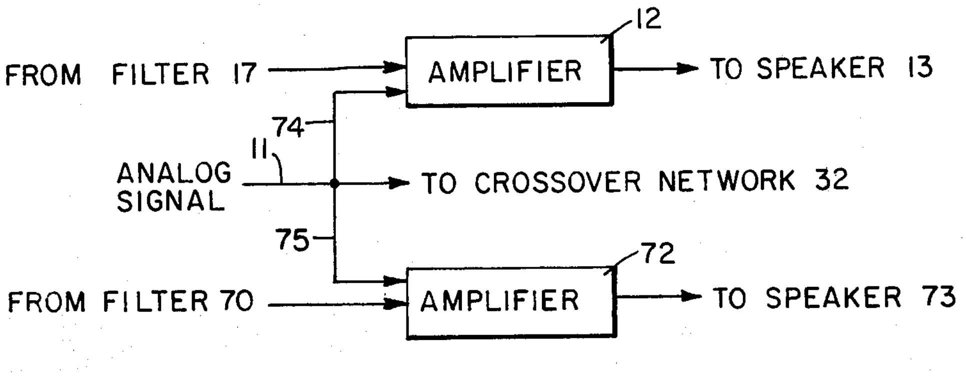
FIGS. 3 and 4 are block diagrams of modified forms of the system of FIG. 2.

According to the present invention, it is possible to still further increase the depth of and thereby enhance the vibrato effect by mixing the delayed analog signal or signals with the original analog input signal. In other words, by permitting a listener to hear not only the delayed, vibrating, audio signal but also the original analog signal, such listener is provided with a stable audible reference to compare the frequency modulated output with and the overall effect is significant. To achieve this, and with reference to FIG. 3, the analog signal on line 11 may be combined with the outputs of low pass filters 17 and 70 in amplifiers 12 and 72, respectively, as shown by connections 74 and 75, respectively. Alternatively, the analog signal on line 11 may be passed through crossover network 32 before application to amplifiers 12 and 72. In either event, the result is a substantially enhanced vibrato effect.

Figure 4:
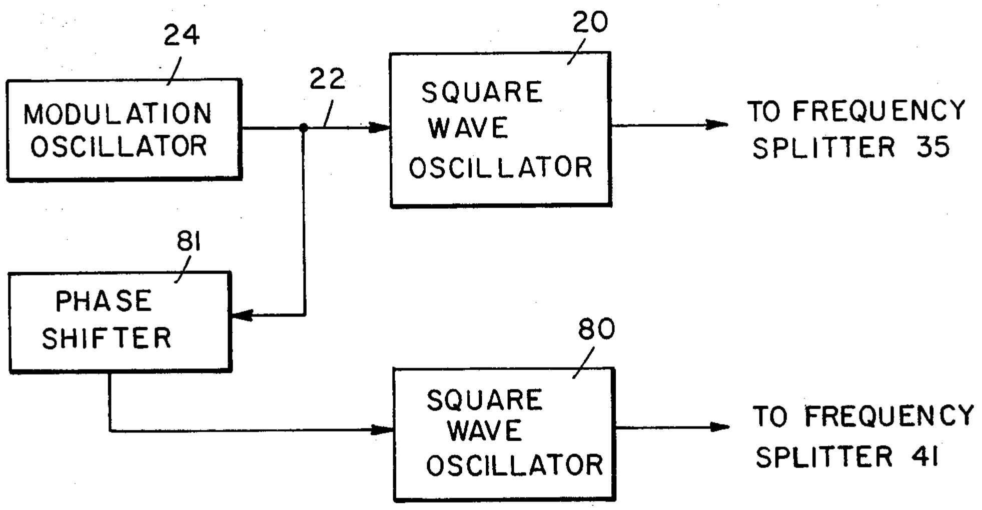

By creating a vibrato effect electronically as described herein, a still further effect is possible which has been unknown heretofore. More specifically, vibrato system 30, which includes first and second analog shift registers 15 and 31, has been described as including a single square wave oscillator 20 for clocking same. Alternatively, and with reference to FIG. 4, vibrato system 30 may include an additional square wave oscillator 80 which receives the output of modulation oscillator 24 via a phase shifter 81. The output of oscillator 80 may then be applied to frequency splitter 41. In this manner, analog shift register 31 would be clocked by oscillator 80, which would have the same center frequency as oscillator 20, oscillator 80 being modulated in synchronism with oscillator 20, but out of phase therewith due to phase shifter 81. Phase shifter 81 could have any desired phase shift. Furthermore, if additional shift registers were employed, a corresponding additional number of oscillators and phase shifters would be required. In any event, while each channel would be frequency modulated by the same amount, the increasing and decreasing frequency outputs of the several channels would be out of phase. This out of phase relationship creates a multi-chorus effect, i.e. the listener no longer perceives a single instrument but rather perceives a chorus of instruments.

It can therefore be seen that in accordance with the present invention, all of the problems associated with the mechanical Leslie speaker system are solved by providing a purely electronic vibrato system. In addition, the present vibrato systems solve the problems of previous electronic vibrato systems in that there is no noise, no frequency discrimination, no amplitude modulation, and no waveshape distortion. That is, the input waveshape is unaltered by shift registers 15 and 31, but the frequency or place in time can be changed by controlling a digital clock network. Since the audio frequency output of oscillator 24 is sweeping a digital clock and the clock is sampling the analog input signal at a frequency many times higher than the highest input frequency, there is no distortion of the input frequency nor is there any frequency selectivity. Thus, the present system is applicable to any music system or any situation where an analog signal is to be shifted in frequency or phase with no change in amplitude. The present system can be manufactured with conventional components and is relatively inexpensive compared not only to the Leslie approach but to other electronic approaches.

While the invention has been described with respect to the preferred physical embodiments constructed in accordance therewith, it will be apparent to those skilled in the art that various modifications and improvements may be made without departing from the scope and spirit of the invention. Accordingly, it is to be understood that the invention is not to be limited by the specific illustrative embodiments, but only by the scope of the appended claims.

I claim:

1. A method of modulating the frequency of an analog signal comprising:
- dividing said analog signal into upper and lower frequency bands;
- separately conducting said upper and lower frequency bands through parallel first and second analog delay lines under control of a digital clock signal; and
- varying the frequency of said digital clock signal at a rate equal to the desired rate of modulation of said analog signal.

2. A method according to claim 1 wherein said lower frequency band is transmitted through second analog delay line at a lower rate than said upper frequency band is transmitted through said first analog delay line.

3. Means for modulating the frequency of an analog signal comprising:
- first and second identical multi-stage, clock controlled, analog shift registers, each having a signal input, a signal output, and a clock input, each said shift register being operative to sample the value of a signal at its signal input and to shift said sampled signal to its signal output, stage by stage, under control of a clock signal applied to its clock input;
- means responsive to said analog signal for dividing said signal into upper and lower frequency bands, said upper frequency band being applied only to said first shift register and said lower frequency band being applied only to said second shift register;
- means for generating a clock signal, said clock signal being applied to said clock inputs of said first and second shift registers; and
- means for modulating the frequency of said clock signal at a rate equal to the desired rate of modulation of said analog signal.

4. In a system having an analog input and output in the audio frequency range, means for producing a vibrato effect comprising:
- first and second multi-stage analog shift registers, each having a signal input, a signal output, and a clock input and being operative to sample the value of a signal applied to its signal input and to shift said sampled signal to the signal output thereof, stage by stage, under control of a clock signal applied to its clock input;
- means responsive to said analog input for dividing said audio frequency range into upper and lower frequency bands;
- first means for applying said upper frequency band only to said signal input of said first shift register, said signal output of said first shift register providing a portion of said analog output;
- second means for applying said lower frequency band only to said second shift register, the signal output of said second shift register providing a portion of said analog output;
- means for generating a clock signal;
- third means for applying said clock signal to said clock input of said first shift register;
- fourth means for applying said clock signal to said clock input of said second shift register; and
- means for modulating the frequency of said clock signal at a subaudio frequency rate.

5. Means for modulating the frequency of an analog signal comprising:
- a multi-stage, clock controlled, analog shift register having a signal input, a signal output, and a clock input, said shift register being operative to sample the value of a signal at its signal input and to shift said sampled signal to said signal output, stage by stage, under control of a clock signal applied to said clock input, said analog signal being applied to said signal input of said shift register;
- means for generating a clock signal, said clock signal being applied to said clock input of said shift register;
- means for modulating the frequency of said clock signal at a rate equal to the desired rate of modulation of said analog signal;
- switch means operatively coupled to said clock signal frequency modulating means for switching the modulating frequency between first and second different frequencies; and
- delay means interposed between said switch means and said clock signal frequency modulating means for controlling the rate at which said modulating frequency changes from said first frequency to said second frequency.

6. Means for modulating the frequency of an analog signal comprising:
- first and second identical multi-stage, clock controlled, analog shift registers, each having a signal input, a signal output, and a clock input, each said shift register being operative to sample the value of a signal at its signal input and to shift said sampled signal to its signal output, stage by stage, under control of a clock signal applied to its clock input;
- means responsive to said analog signal for dividing said signal into upper and lower frequency bands, said upper frequency band being applied to said first shift register and said lower frequency band being applied to said second shift register;
- means for generating a clock signal, said clock signal being applied to said clock inputs of said first and second shift registers;
- means for modulating the frequency of said clock signal at a rate equal to the desired rate of modulation of said analog signal; and
- frequency dividing means for dividing the frequency of said clock signal prior to application to said clock input of said second shift register.

7. Means for modulating the frequency of an analog signal according to claim 6, wherein said frequency dividing means divides the frequency of said clock signal by a factor of 2.

8. In a system having an analog input and output in the audio frequency range, means for producing a vibrato effect comprising:
- first and second multi-stage analog shift registers, each having a signal input, a signal output, and a clock input and being operative to sample the value of a signal applied to its signal input and to shift said sampled signal to the signal output thereof, stage by stage, under control of a clock signal applied to its clock input;

means responsive to said analog input for dividing said audio frequency range into upper and lower frequency bands;

first means for applying said upper frequency band to said signal input of said first shift register, said signal output of said first shift register providing a portion of said analog output;

second means for applying said lower frequency band to said second shift register, the signal output of said second shift register providing a portion of said analog output;

means for generating a clock signal;

third means for applying said clock signal to said clock input of said first shift register;

frequency dividing means for dividing the frequency of said clock signal and for applying said frequency divided clock signal to said clock input of said second shift register; and means for modulating the frequency of said clock signal at a subaudio frequency rate.

9. In a system according to claim 8 wherein said frequency dividing means divides the frequency of said clock signal by a factor of 2.

* * * * *